(12) United States Patent
Joy et al.

(10) Patent No.: US 12,176,663 B2
(45) Date of Patent: Dec. 24, 2024

(54) MULTI-HEAD CABLE CONNECTOR WITH FLEXIBLE FINGERS

(71) Applicant: Crestron Electronics, Inc., Rockleigh, NJ (US)

(72) Inventors: Edward J. Joy, Carmel, NY (US); Marc Dubowski, Fishkill, NY (US); Howard Balch, Bloomingdale, NJ (US)

(73) Assignee: Crestron Electronics, Inc., Rockleigh, NJ (US)

( * ) Notice: Subject to any disclaimer, the term of this patent is extended or adjusted under 35 U.S.C. 154(b) by 233 days.

(21) Appl. No.: 17/835,157

(22) Filed: Jun. 8, 2022

(65) Prior Publication Data

US 2023/0402802 A1 Dec. 14, 2023

(51) Int. Cl.
*H01R 27/02* (2006.01)
*H01R 12/77* (2011.01)
*H01R 13/58* (2006.01)
*H05K 1/18* (2006.01)

(52) U.S. Cl.
CPC .......... *H01R 27/02* (2013.01); *H01R 12/772* (2013.01); *H01R 13/5845* (2013.01); *H05K 1/189* (2013.01)

(58) Field of Classification Search
CPC .. H01R 27/02; H01R 27/772; H01R 13/5845; H05K 1/189
See application file for complete search history.

(56) References Cited

U.S. PATENT DOCUMENTS

| | | |
|---|---|---|
| 5,443,400 A | 8/1995 | Brown et al. |
| D387,733 S | 12/1997 | Lee |
| D392,942 S | 3/1998 | Lee |
| 5,984,717 A | 11/1999 | Lee |
| D438,510 S | 3/2001 | Leen |
| D449,275 S * | 10/2001 | Goto .......................... D13/153 |
| 7,057,108 B1 * | 6/2006 | Sodemann ......... H01R 13/7135 439/639 |
| 7,121,852 B2 * | 10/2006 | Ng ....................... H01R 35/04 439/31 |

(Continued)

FOREIGN PATENT DOCUMENTS

CN 110690629 A * 1/2020

OTHER PUBLICATIONS

"Crestron Mercury™ Multihead HD Video Cable, CBL-MULTI-HD-6", Spec Sheet, 2017, Crestron Electronics, Inc.

(Continued)

*Primary Examiner* — Harshad C Patel
(74) *Attorney, Agent, or Firm* — Crestron Electronics, Inc.

(57) ABSTRACT

An electronic connector includes a rigid central region and at least one branch that extends away from the rigid central region. A flexible part is disposed at one end of the at least one branch and adjacent to the rigid central region. A conductor terminal is located at an opposing end of the at least one branch. A rigid part is disposed between the flexible part and the conductor terminal. At least one flexible element is disposed adjacent to one surface of the flexible part. The flexible part of the at least one branch and the at least one flexible element combine to permit the at least one branch to be both (i) sufficiently flexible to permit the at least one branch to be bent, and (ii) sufficiently rigid to permit the at least one branch to subsequently return to its original shape.

10 Claims, 8 Drawing Sheets

(56) References Cited

U.S. PATENT DOCUMENTS

| | | | |
|---|---|---|---|
| 7,238,046 B2 * | 7/2007 | Chou | H05K 1/18 |
| | | | 439/541.5 |
| D556,134 S | 11/2007 | Lee et al. | |
| 7,318,750 B1 * | 1/2008 | Chacon | H01R 33/90 |
| | | | 200/51.03 |
| D562,253 S | 2/2008 | Henderson | |
| D573,095 S | 7/2008 | Poupore et al. | |
| D586,752 S * | 2/2009 | Diamond | D13/153 |
| D607,819 S | 1/2010 | Sell et al. | |
| D621,507 S | 8/2010 | Romero | |
| 7,815,460 B2 * | 10/2010 | Lin | H01R 9/03 |
| | | | 439/358 |
| 7,867,025 B2 | 1/2011 | Montena | |
| D635,930 S * | 4/2011 | Li | D13/153 |
| D651,977 S | 1/2012 | Lee | |
| 8,128,126 B2 | 3/2012 | Poupore et al. | |
| D665,750 S | 8/2012 | Li et al. | |
| 8,267,722 B2 * | 9/2012 | Zhou | H01R 13/6582 |
| | | | 439/607.25 |
| 8,282,401 B2 * | 10/2012 | Hensen | H01R 24/547 |
| | | | 439/76.1 |
| 8,298,003 B2 * | 10/2012 | Wu | H01R 27/02 |
| | | | 439/501 |
| 8,357,142 B2 | 1/2013 | Romero | |
| D679,656 S * | 4/2013 | Richards | D13/146 |
| 8,517,772 B2 * | 8/2013 | Wu | H01R 24/62 |
| | | | 439/501 |
| D689,440 S | 9/2013 | Lee et al. | |
| D715,741 S * | 10/2014 | Dallmeyer | D13/146 |
| D739,356 S | 9/2015 | Lin | |
| 9,153,926 B2 * | 10/2015 | Wu | H01R 24/60 |
| D757,952 S | 5/2016 | Wibenga et al. | |
| 9,385,464 B2 * | 7/2016 | Wu | H01R 27/00 |
| 9,437,982 B2 * | 9/2016 | Wu | H01R 43/20 |
| D773,401 S | 12/2016 | Koenig | |
| D777,110 S | 1/2017 | Ferretti et al. | |
| D783,541 S | 4/2017 | Minn et al. | |
| D815,602 S | 4/2018 | Koenig | |
| 10,027,080 B2 * | 7/2018 | Solland | H01R 29/00 |
| D884,639 S | 5/2020 | Jhun et al. | |
| D890,702 S | 7/2020 | Jhun et al. | |
| D890,761 S | 7/2020 | Borthne-Trygsland | |
| D896,785 S | 9/2020 | Li | |
| D934,175 S | 10/2021 | Widdows | |
| 11,158,985 B1 * | 10/2021 | Sumida | H04N 21/43635 |
| D983,796 S | 4/2023 | Zeng | |
| D984,967 S | 5/2023 | Jhun et al. | |
| D993,196 S | 7/2023 | Huang | |
| 2009/0113101 A1 * | 4/2009 | Liu | H01R 31/06 |
| | | | 710/300 |
| 2010/0190377 A1 | 7/2010 | Islam | |
| 2014/0273636 A1 * | 9/2014 | Ye | H01R 13/6658 |
| | | | 439/660 |

OTHER PUBLICATIONS

"Cisco Multi-Head Cables", DataSheet, Dec. 2021.
Notice of References Cited (PTO-892), U.S. Appl. No. 29/826,059, U.S. Patent and Trademark Office, filed Apr. 23, 2024.
Notice of References Cited (PTO-892), U.S. Appl. No. 29/826,059, U.S. Patent and Trademark Office, filed Jun. 12, 2024.

* cited by examiner

MULTI-HEAD CABLE CONNECTOR WITH FLEXIBLE FINGERS

BACKGROUND OF THE INVENTION

Technical Field

The present embodiments relate to electronic connectors and, more particularly, to multi-head cable connectors for providing connections via a cable having plural inputs.

Background Art

In many applications, it is desirable to provide inputs of differing formats or outputs of differing formats. For example, in many videoconferencing and other video applications, it is often desirable to be able to receive signals of USB, USB-C, micro-USB, HDMI, DisplayPort, Mini DisplayPort and/or other signal formats and then output the signal in another of these formats. Ordinarily, to convert an input signal of one format to an output signal of another format, a dongle is used that has a connector at one end for the input of that format and a connector at the other end for the output of another format. Because such dongles only convert from one particular format to another, to be able to convert from one of multiple possible input formats to an another of multiple possible output formats requires having a particular dongle for each possible pairing of input and output formats. Thus, an individual preparing to attend a video conference or meeting, for example, would be required either to know in advance the formats to be used for video input and output, or alternatively, carry a number of dongles with them for the meeting.

To avoid the necessity of carrying a large number of different dongles, 2-in-1 or 3-in-1 cables are known in which two or more cables of differing input formats join together and output to a single cable of a further format. However, because only one of the two or three input cables is used, the unused unput cables are left to dangle and possibly get in the way of the user's or others' devices.

Alternatively, multi-head cables are known in which several input terminals of different formats extend from a single rigid end piece from which a single output cable extends. For example, the Crestron® Mercury™ Multihead HD Video Cable provides HDMI, DisplayPort, Mini DisplayPort and USB inputs from a single connector head and outputs an HDMI format signal. Alternatively, the Cisco Multi-Head cable provides a single connector head with USB, Mini DisplayPort, and HDMI inputs to a single HDMI output. Each of these multi-head connectors have a single connector block that, when one of its terminals is connected into a port of a laptop or other device, could block, or interfere with the ability to connect to other adjacent ports of the device.

It is therefore desirable to provide a multi-head cable connector that is capable of receiving inputs of different formats and that can connect to one port of a laptop or other device without obstructing the other ports of the device.

SUMMARY OF THE INVENTION

It is to be understood that both the general and detailed descriptions that follow are exemplary and explanatory only and are not restrictive.

DISCLOSURE OF INVENTION

In accordance with an aspect, an electronic connector comprises: (a) an electrical board, including: (1) a rigid central region, and (2) at least one branch that extends away from the central region, and including (A) a flexible part disposed at one end of the at least one branch and adjacent to the rigid central region, (B) a conductor terminal located at an opposing end of the at least one branch, (C) a rigid part disposed between the flexible part and the conductor terminal, and (D) at least one flexible element disposed adjacent to one surface of the flexible part, (3) wherein the flexible part of the at least one branch and the at least one flexible element combine to permit the at least one branch to be both (I) sufficiently flexible to permit the at least one branch to be bent, and (ii) sufficiently rigid to permit the at least one branch to subsequently return to its original shape.

According to a further aspect, an electronic connector comprises: (a) an electrical board including: (1) a rigid central region, and (2) a plurality of branches that each extend away from the central region, each including (A) a flexible part disposed at one end of that branch and adjacent to the rigid central region, (B) a conductor terminal located at an opposing end of that branch, (C) a rigid part disposed between the flexible part and the conductor terminal, (D) a first flexible element disposed adjacent to a first surface of the flexible part, and (E) a second flexible element disposed adjacent to a second surface of the flexible part, (F) wherein the first and second flexible elements are each (1) thinnest in a bendable region part way between opposing ends of that flexible element, and (ii) increase in thickness and rigidity with increasing proximity to each of its opposing ends; (3) wherein (A) for each one of the plurality of branches, the flexible part and the first and second flexible elements combine to permit that branch to be both (a) sufficiently flexible to permit that branch to be bent, and (ii) sufficiently rigid to permit that branch to subsequently return to its original shape, (B) upon a given one of the plurality of branches being inserted into a port of a device, at least another one of the plurality of branches is bendable to clear an adjacent port of that device, and (C) upon the given one of the plurality of branches being removed from the port of the device, the another one of the plurality of branches returns to its original shape.

According to another aspect, an electronic connector comprises: (a) an electrical board including: (1) a rigid central region, including (A) first, second and third stub portions each extending from and unitary with the rigid central region (2) first, second and third branches each extending away from the central region, each including (A) a flexible part at one end of that branch and extending from a respective one of the first, second and third stub portions, the flexible part being comprised of aluminum, (B) a conductor terminal located at an opposing end of that branch, (C) a rigid part disposed between the flexible part and the conductor terminal, (D) a first flexible element disposed adjacent to a first surface of the flexible part, and (E) a second flexible element disposed adjacent to a second surface of the flexible part, (F) wherein the first and second flexible elements are each (is) comprised of a plastic material, (ii) thinnest in a bendable region part way between opposing ends of that flexible element, and (iii) increase in thickness and rigidity with increasing proximity to each of its opposing ends; (3) wherein (A) for each one of the first, second and third branches, the flexible part and the first and second flexible elements of that branch combine to permit that branch to be both (i) sufficiently flexible to permit that branch to be bent, and (ii) sufficiently rigid to permit that branch to subsequently return to its original shape, (B) upon a given one of the first, second and third branches being inserted into a port of a device, another one of the first, second and third branches is bendable to clear an adjacent port of that device, and (C) upon the given one of the first, second and third branches being removed from the port of the device, the another one of the first, second and third branches returns to its original shape; (b) electronic circuitry disposed on (1) the rigid central region of the electrical board and electrically connected to a cable extending from the rigid central region, or (2) the rigid part of at least one of the first, second and third branch and electrically connected to the conductor terminal of that branch; (c) a pair of cover plates disposed atop opposing sides of the rigid central region of the electrical board; and (d) an external skin covering pair of cover plates and the electrical board, wherein (1) the conductor terminal of each of the first, second and third branched extends through an associated opening in the external skin, and (2) the external skin is comprised of a rubber material.

BRIEF DESCRIPTION OF DRAWINGS

The accompanying figures further illustrate the present embodiments.

The components in the drawings are not necessarily drawn to scale, emphasis instead being placed upon clearly illustrating the principles of the present embodiments. In the drawings, like reference numerals designate corresponding parts throughout the several views.

BRIEF DESCRIPTION OF THE SEVERAL VIEWS OF THE DRAWING

DETAILED DESCRIPTION OF THE INVENTION

The present embodiments provide a multi-head cable connector with flexible fingers.

Unless the context clearly requires otherwise, throughout the description and the claims, the words "comprise", "comprising", and the like are to be construed in an inclusive sense as opposed to an exclusive or exhaustive sense; that is to say, in the sense of "including, but not limited to".

LIST OF REFERENCE NUMBERS FOR THE MAJOR ELEMENTS IN THE DRAWING

The following is a list of the major elements in the drawings in numerical order.
100 Multi-head Cable Connector
102 Central Board
104 First Finger or Branch
105 Flexible Part
106 Second Finger or Branch
107 Flexible Part
108 Third Finger or Branch
109 Flexible Part
110 Central Region
110a First Stub
110b Second Stub
110c Third Stub
114 Rigid Part
116 Rigid Part
118 Rigid Part
122 Front Flexible Element
124 Front Flexible Element
126 Front Flexible Element
132 Back Flexible Element
134 Back Flexible Element
136 Back Flexible Element
140 Front Cover Plate
142 Back Cover Plate
144 Slot
146 Opening
154 Connector Terminal
156 Connector Terminal
158 Connector Terminal
162 Central Board Circuitry
164 First Finger or Branch Circuitry
166 Second Finger or Branch Circuitry
168 Third Finger or Branch Circuitry
180 Cable
202 Extension
204 Ribs
206 Curved Front Surface
208 Flat Rear Surface
212 Upper Thick Portion
214 Thin Portion
216 Lower Thick Portion
302 Extension
304 Ribs
306 Curved Front Surface
308 Flat Rear Surface
312 Upper Thick Portion
314 Thin Portion
316 Lower Thick Portion
402 Extension
404 Ribs
406 Curved Front Surface
408 Flat Rear Surface
412 Upper Thick Portion
414 Thin Portion
416 Lower Thick Portion
502 Extension
506 Curved Front Surface
508 Flat Rear Surface
512 Upper Thick Portion
514 Thin Portion 516 Lower Thick Portion
606 Curved Front Surface
608 Flat Rear Surface
612 Upper Thick Portion
614 Thin Portion
616 Lower Thick Portion
708 Flat Rear Surface
900 Rubber Skin

MODE(S) FOR CARRYING OUT THE INVENTION

The embodiment described herein in the context of a multi-head cable connector with flexible fingers, but is not limited thereto, except as may be set forth expressly in the appended claims.

Figure 1:
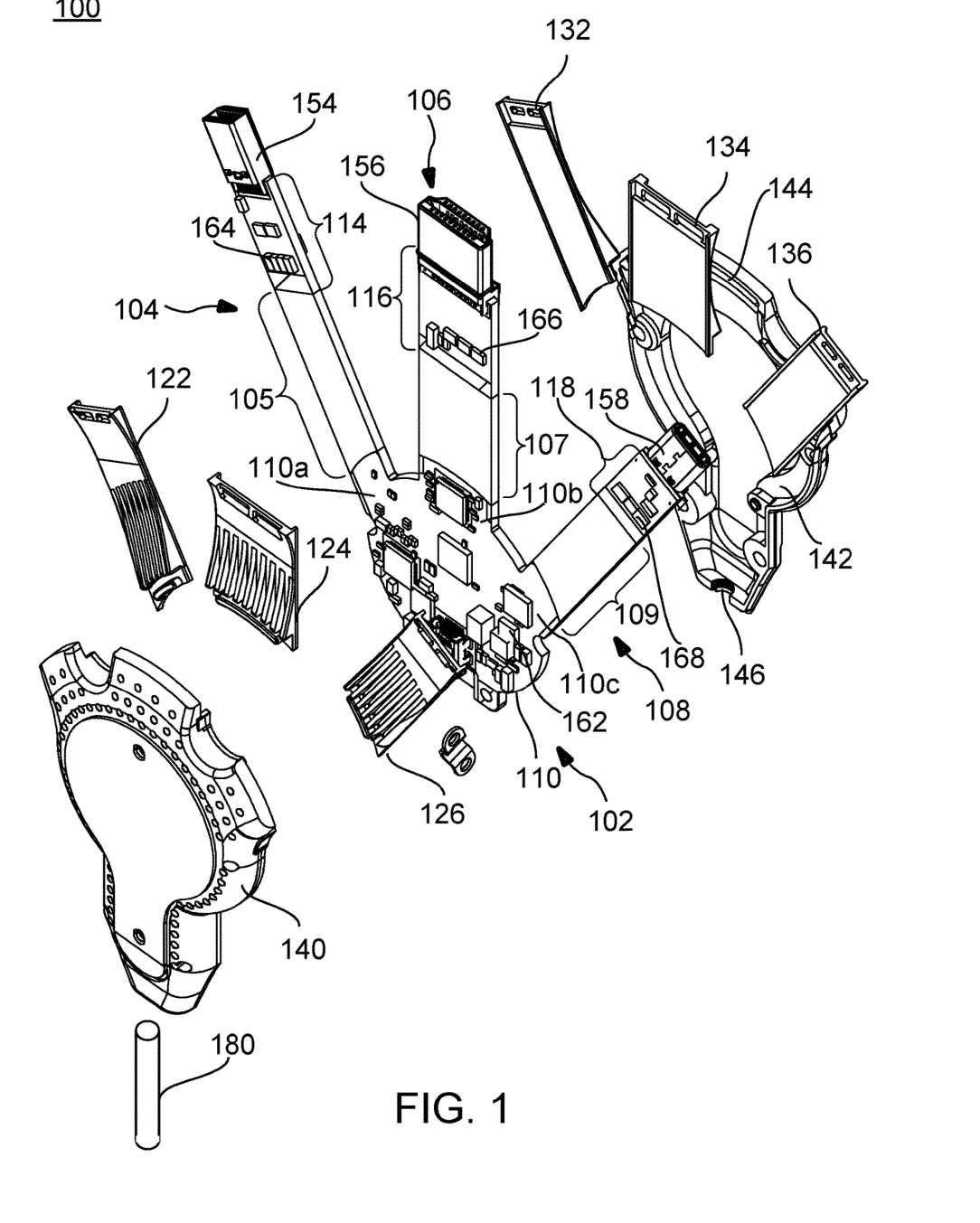
FIG. 1 shows an exploded perspective view of a multi-head cable connector with flexible fingers in accordance with an embodiment.

Referring first to FIG. 1, an exploded perspective view of a multi-head cable connector with flexible fingers 100 is shown in accordance with an embodiment. The multi-head cable connector 100 includes a central board 102, a first finger or branch 104, a second finger or branch 106, and a third finger or branch 108.

The central board 102 includes a central region 110, a first stub 110a, a second stub 110b, and a third stub 110c. The first stub 110a is also the base of the first finger or branch 104, the second stub 110b is also the base of the second finger or branch 106, and the third stub 110c is also the base of the third finger or branch 108. The central board 102 may be formed of a fiberglass (FR4) laminate over a polyimide (FPC) film or of another rigid plastic.

The first finger or branch 104 includes the first stub 110a, a flexible part 105, a rigid part 114, a connector terminal 154, a front flexible element 122, and a back flexible element 132. The flexible part 105 has a first end which extends from the first stub 110a and may be formed of aluminum. The rigid part 114 has a first end which extends from a second end of the flexible part 105. The rigid part 114 may be formed of a fiberglass (FR4) laminate over a polyimide (FPC) film or of another rigid plastic. The connector terminal 154 extends from a second end of the rigid part 114 and is configured for insertion into a data port of a first video format.

The front flexible element 122 is mounted atop a front surface of the flexible part 105, and the back flexible element 132 is mounted atop a rear surface of the flexible part 105.

The second finger or branch 106 includes the second stub 110b, a flexible part 107, a rigid part 116, a connector terminal 156, a front flexible element 126, and a back flexible element 134. The flexible part 107 may be formed of aluminum and has a first end which extends from the first stub 110b. The rigid part 116 may be formed of a fiberglass (FR4) laminate over a polyimide (FPC) film or of another rigid plastic and has a first end which extends from a second end of the flexible part 107. The connector terminal 156 extends from a second end of the rigid part 116 and is configured for insertion into a data port of a second video format different than the first video format.

The front flexible element 124 is mounted atop a front surface of the flexible part 107, and the back flexible element 134 is mounted atop a rear surface of the flexible part 107.

The third finger or branch 108 includes the third stub 110c, a flexible part 109, a rigid part 118, a connector terminal 158, a front flexible element 126, and a back flexible element 136. The flexible part 109 may be formed of aluminum and has a first end which extends from the first stub 110b. The rigid part 118 has a first end which extends from a second end of the flexible part 109 and may be formed of a fiberglass (FR4) laminate over a polyimide (FPC) film or of another rigid plastic. The connector terminal 158 extends from a second end of the rigid part 118 and is configured for insertion into a data port of a third video format differing from the first and second video formats.

The front flexible element 126 is mounted atop a front surface of the flexible part 109, and the back flexible element 136 is mounted atop a rear surface of the flexible part 109.

A plurality of electronic circuitry 162 may be disposed on the central region 110 and may be electrically connected to an external cable 180 which, in turn, is connected to an output connector terminal (not shown). Additionally, electronic circuitry 164 may be disposed on the rigid part 114 of the first finger or branch 104 and electrically connected to both the electronic circuitry 162 and the connector terminal 154, electronic circuitry 166 may be disposed on the rigid part 116 of the second finger or branch 106 and electrically connected to both the electronic circuitry 162 and the connector terminal 156, and electronic circuitry 168 may be disposed on the rigid part 118 of the third finger or branch 108 and electrically connected to both the electronic circuitry 162 and the connector terminal 158.

The electronic circuitry 164 may be used in combination with the electronic circuitry 162 to provide an active converter of the video signals of the first input format to that of the output format. The electronic circuitry 166 may be used in combination with the electronic circuitry 162 to provide an active converter of the video signals of the second input format to that of the output format. The electronic circuitry 168 may be used in combination with the electronic circuitry 162 to provide an active converter of the video signals of the third input format to that of the output format.

Figure 2A:
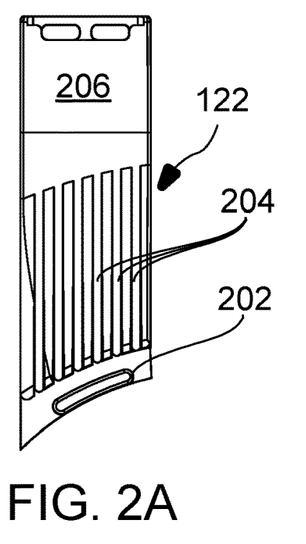
FIGS. 2A-2E show close-up front, side, rear, perspective, and bottom views, respectively, of a front flexible element shown in FIG. 1.
Figure 2B:
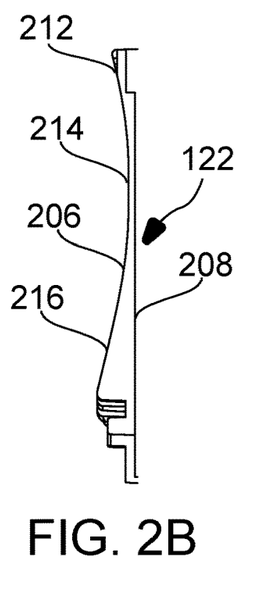
Figure 2C:
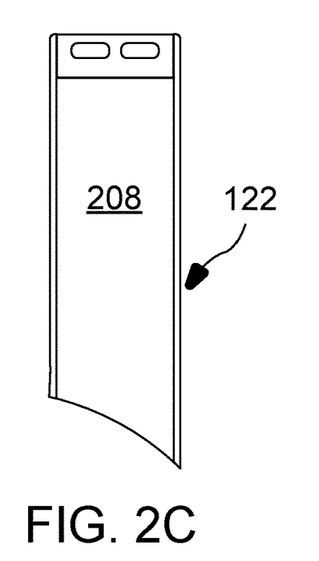
Figure 2D:
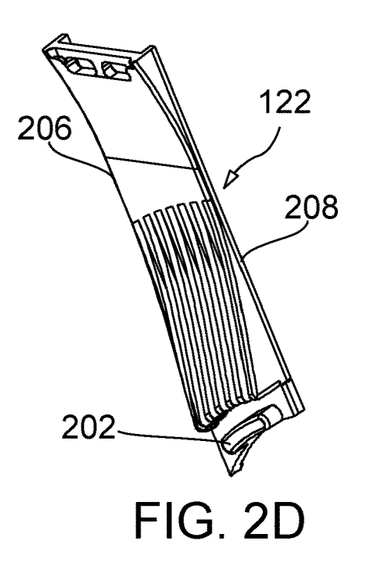
Figure 2E:
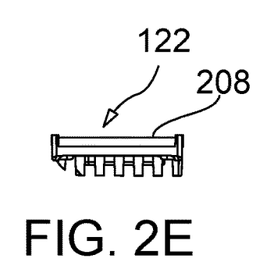
Figure 3A:
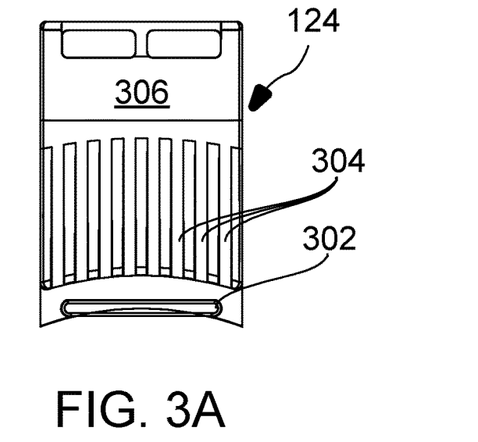
FIGS. 3A-3E show close-up front, side, rear, perspective, and bottom views, respectively, of another front flexible element shown in FIG. 1.
Figure 3B:
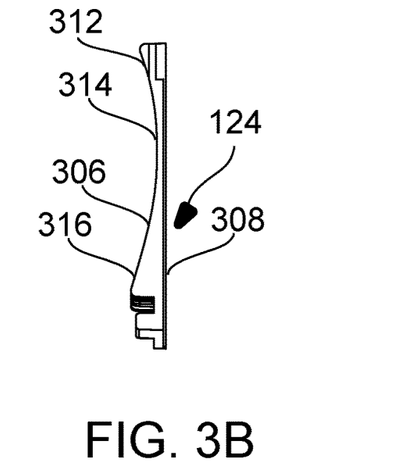
Figure 3C:
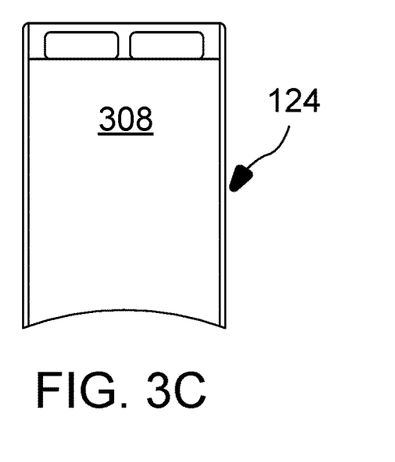
Figure 3D:
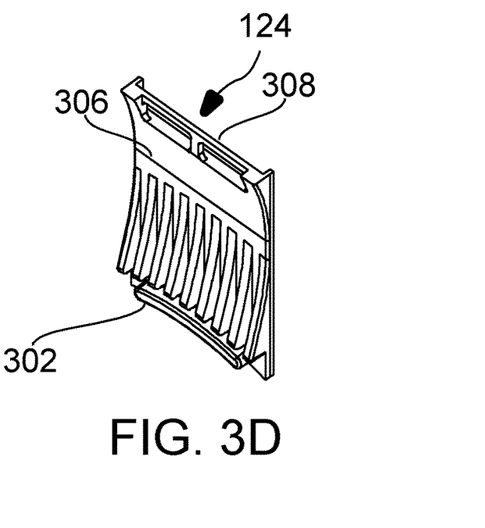
Figure 3E:
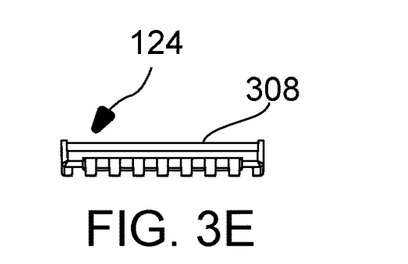
Figure 4A:
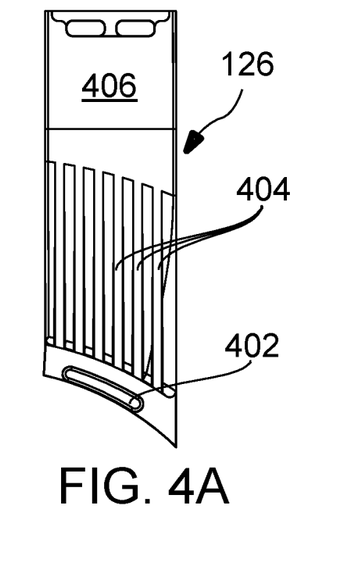
FIGS. 4A-4E show close-up front, side, rear, perspective, and bottom views, respectively, of yet another front flexible element shown in FIG. 1.
Figure 4B:
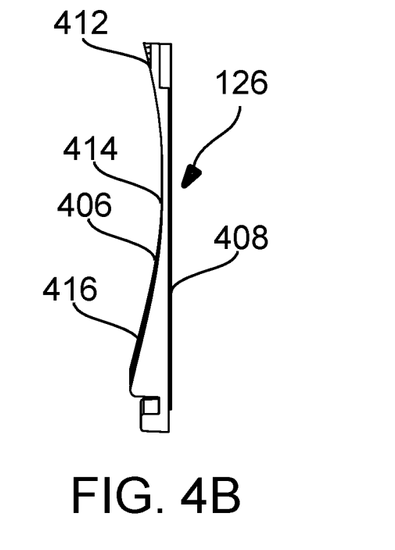
Figure 4C:
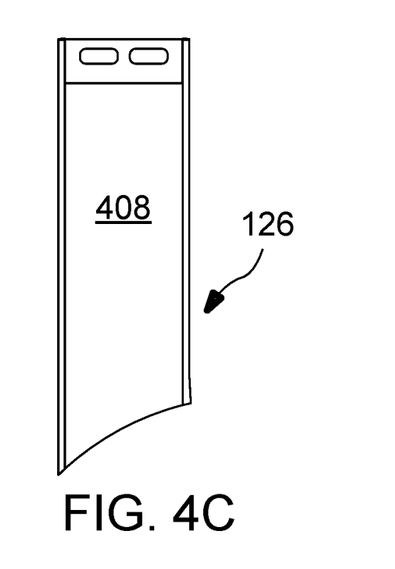
Figure 4D:
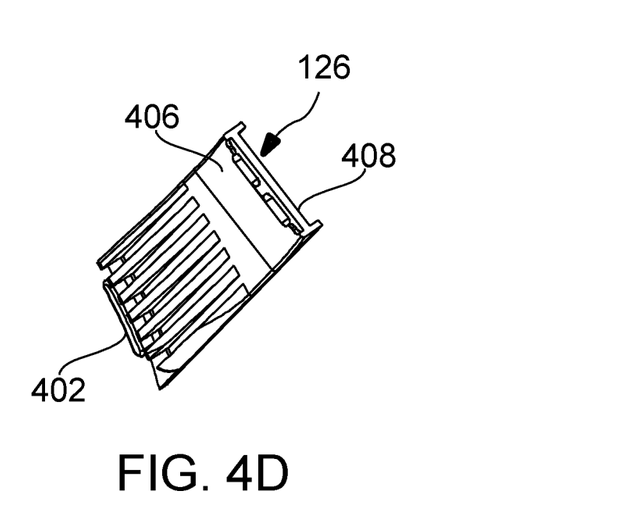
Figure 4E:
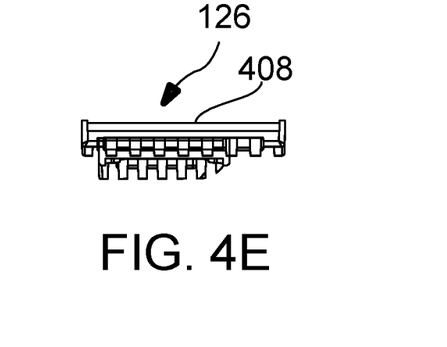

A rigid front cover plate 140 is disposed atop the front side of the central board 102 and covers the front side of the central region 110, the first stub 110a, the second stub 110b, and the third stub 110c, as well as the central board circuitry 162. A rigid back cover plate 142 is disposed atop the rear side of the central board 102 and covers the rear side of the central region 110, the first stub 110a, the second stub 110b, and the third stub 110c. The front cover plate 140 and the back cover plate 142 may be formed of polypropylene or another rigid plastic FIGS. 2A-2E show the front flexible element 122 of FIG. 1 in greater detail. Specifically, FIG. 2A shows a front view of the front flexible element 122, FIG. 2B shows a side view of the front flexible element 122, FIG. 2C shows a rear view of the front flexible element 122, FIG. 2D shows a front perspective view of the front flexible element 122, and FIG. 2E shows a bottom view of the front flexible element 122.

The front flexible element 122 includes a curved front surface 206 in which a plurality of ribs 204 are formed, as well as a flat rear surface 208. The curvature of the front surface 206 results in the front flexible element 122 having a more rigid, thicker upper portion 212, a thinner middle portion 214, and a more rigid, thicker lower portion 216. The thinner middle portion 214 provides a bendable region for the front flexible element 122, particularly at its narrowest point.

An extension 202 is located at the bottom of the front flexible element 122 and is used for securing the front flexible element 122 in place. Specifically, the flat rear surface 208 of the front flexible element 122 is placed against the front surface of the flexible part 105, and then the extension 202 is held in place by the front cover plate 140.

FIGS. 3A-3E show the front flexible element 124 of FIG. 1 in greater detail. Specifically, FIG. 3A-3E show front, side, rear, front perspective, and bottom views, respectively, of the front flexible element 124.

The front flexible element 124 includes a curved front surface 306, in which a plurality of ribs 304 are formed, as well as a flat rear surface 308. The curvature of the front surface 306 results in the front flexible element 124 having a more rigid, thicker upper portion 312 and lower portion 316, with a thinner middle portion 314 between the upper portion 312 and the lower portion 316. The thinner middle portion 314 provides a bendable region for the front flexible element 124, particularly at its narrowest point.

An extension 302 is located at the bottom of the front flexible element 124 and is used for securing the front flexible element 124 in place. Specifically, the flat rear surface 308 of the front flexible element 124 is placed facing the front surface of the flexible part 107, and then the extension 302 is held in place by the front cover plate 140.

FIGS. 4A-4E show the front flexible element 126 of FIG. 1 in greater detail. Specifically, FIG. 4A-4E respectively show front, side, rear, front perspective, and bottom views of the front flexible element 124.

The front flexible element 126 includes a curved front surface 406, in which a plurality of ribs 404 are formed, as well as a flat rear surface 408. The curvature of the front surface 406 results in the front flexible element 126 having a more rigid, thicker upper portion 412 and lower portion 416, with a thinner middle portion 414 between the upper portion 412 and the lower portion 416. The thinner middle portion 414 provides a bendable region for the front flexible element 126, particularly at its narrowest point.

An extension 402 is located at the bottom of the front flexible element 126 and is used for securing the front flexible element 126 in place. Specifically, the flat rear surface 408 of the front flexible element 126 is placed facing the front surface of the flexible part 109, and then the extension 402 is held in place by the front cover plate 140.

Figure 5:
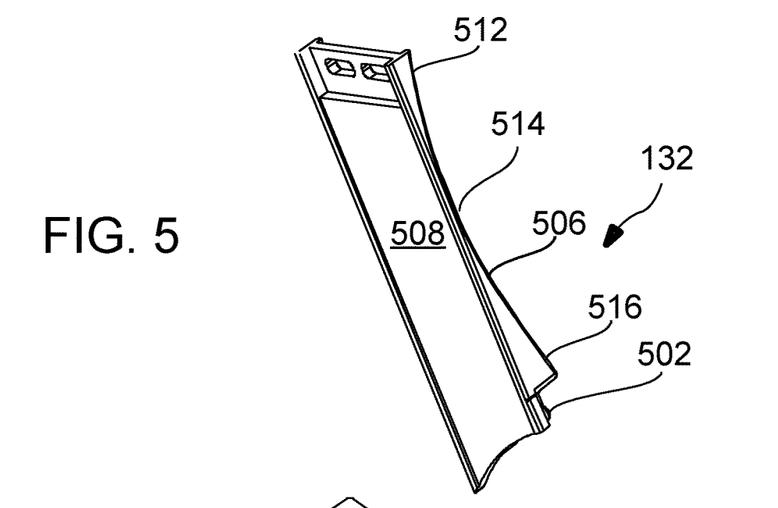
FIG. 5 shows a close-up perspective view of a back flexible element shown in FIG. 1.

FIG. 5 shows a close-up perspective view of the back flexible element 132 shown in FIG. 1. The back flexible element 132 is essentially a mirror image of the front flexible element 122 and includes a curved front surface 506 in which a plurality of ribs (not shown) are formed, and a flat rear surface 508, which are analogous to the front and rear surfaces 206, 208, respectively, of the front flexible element 122.

The back flexible element 132 also includes a thicker upper portion 512, a thinner middle portion 514, and a thicker lower portion 516 which are analogous to the upper portion 212, the middle portion 214, and the lower portion 216, respectively, of the front flexible element 122. The thinner middle portion 514 of back flexible element 132 also provides the back flexible element 132 with a bendable region analogous to that of the middle portion 214 of the front flexible element 122.

An extension 502 is located at the bottom of the back flexible element 132 and is used for securing the back flexible element 132 in place using the back cover plate 142 in a manner analogous to that of the extension 202.

Figure 6:
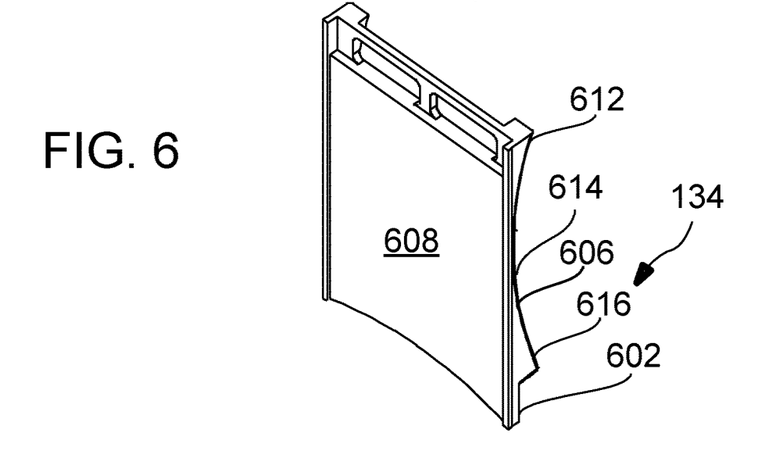
FIG. 6 shows a close-up perspective view of another back flexible element shown in FIG. 1.

FIG. 6 shows a close-up perspective view of the back flexible element 134 of FIG. 1. The back flexible element 134 is essentially a mirror image of the front flexible element 124 and includes a curved front surface 606 in which a plurality of ribs (not shown) are formed, and a flat rear surface 608 are analogous to the front and rear surfaces 306, 308, respectively, of the front flexible element 124.

The back flexible element 134 also includes a thicker upper portion 612, a thinner middle portion 614 and a thicker lower portion 616 which are analogous to the upper portion 312, the middle portion 314, and the lower portion 316, respectively, of the front flexible element 124. The middle portion 614 of the back flexible element 134 therefore provides the back flexible element 134 with a bendable region analogous to that of the middle portion 314 of the front flexible element 124.

An extension 602 is located at the bottom of the back flexible element 134 and is used for securing the back flexible element 134 in place using the back cover plate 142 in a manner analogous to that of the extension 302. For example, the extension 602 located at the bottom of the back flexible element 134 may, as FIG. 1 shows, face a slot 144 formed in the back cover plate 142.

Figure 7:
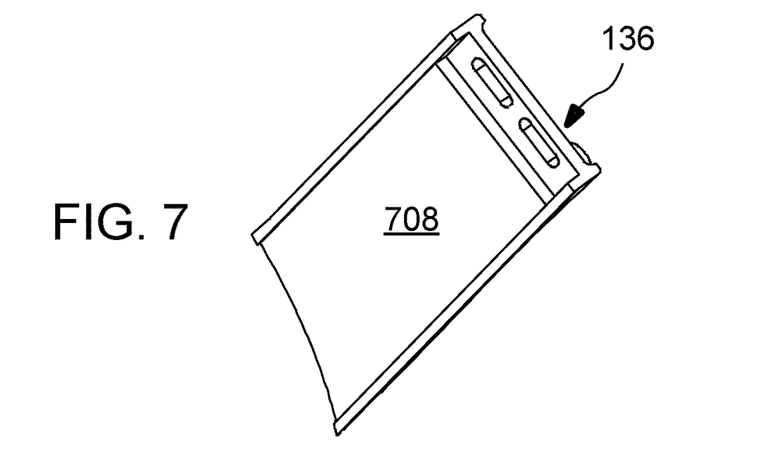
FIG. 7 shows a close-up perspective view of still another back flexible element shown in FIG. 1.

FIG. 7 shows a close-up perspective view of the back flexible element 136 shown in FIG. 1. The back flexible element 134 is essentially a mirror image of the front flexible element 126 and includes a curved front surface (not shown) in which a plurality of ribs (not shown) are formed, and a flat rear surface 708, each of which are analogous to the front and rear surfaces 406, 408, respectively, of the front flexible element 126.

The back flexible element 136 also includes a thicker upper portion (not shown), a thinner middle portion (not shown) and a thicker lower portion (not shown), which are analogous to the upper portion 412, the middle portion 414, and the lower portion 416, respectively, of the front flexible element 126. The middle portion of the back flexible element 136 thus provides the back flexible element 136 with a bendable region analogous to that of the middle portion 414 of the front flexible element 126.

An extension (not shown) is located at the bottom of the back flexible element 136 and is used for securing the back flexible element 136 in place using the back cover plate 142 in a manner analogous to that of the extension 402.

Referring back to FIG. 1, when the rear surface 208 of the front flexible element 122 is mounted atop the front surface of the flexible part 105 of the first finger or branch 104, and the rear surface 508 of the back flexible element 132 is mounted atop the rear surface of the flexible part 105, the combination of the bendable, thin metal flexible part 105, the bendable, thinner region 214 of the front flexible element 122, and the bendable, thinner region 514 of the back flexible element 132 permit the first finger or branch 104 to be sufficiently flexible so as to be bendable while also being sufficiently rigid so as the return the first finger or branch 104 to its original position after bending.

Similarly, when the rear surface 308 of the front flexible element 124 is mounted atop the front surface of the flexible part 107 of the second finger or branch 106, and the rear surface 608 of the back flexible element 134 is mounted atop the rear surface of the flexible part 107, the combination of the bendable, thin metal flexible part 107, the bendable, thinner region 314 of the front flexible element 124, and the bendable, thinner region 614 of the back flexible element 134 permit the second finger or branch 106 to be sufficiently flexible so as to be bendable while also being sufficiently rigid so as the return the second finger or branch 106 to its original position after bending.

Also, when the rear surface 408 of the front flexible element 126 is mounted atop the front surface of the flexible part 109 of the third finger or branch 108, and the rear surface 708 of the back flexible element 136 is mounted atop the rear surface of the flexible part 109, the combination of the bendable, thin metal flexible part 109, the bendable, thinner region 414 of the front flexible element 126, and the bendable, thinner region of the back flexible element 136 permit the third finger or branch 108 to be sufficiently flexible so as to be bendable while also being sufficiently rigid so as the return the third finger or branch 108 to its original position after bending.

Figure 8:
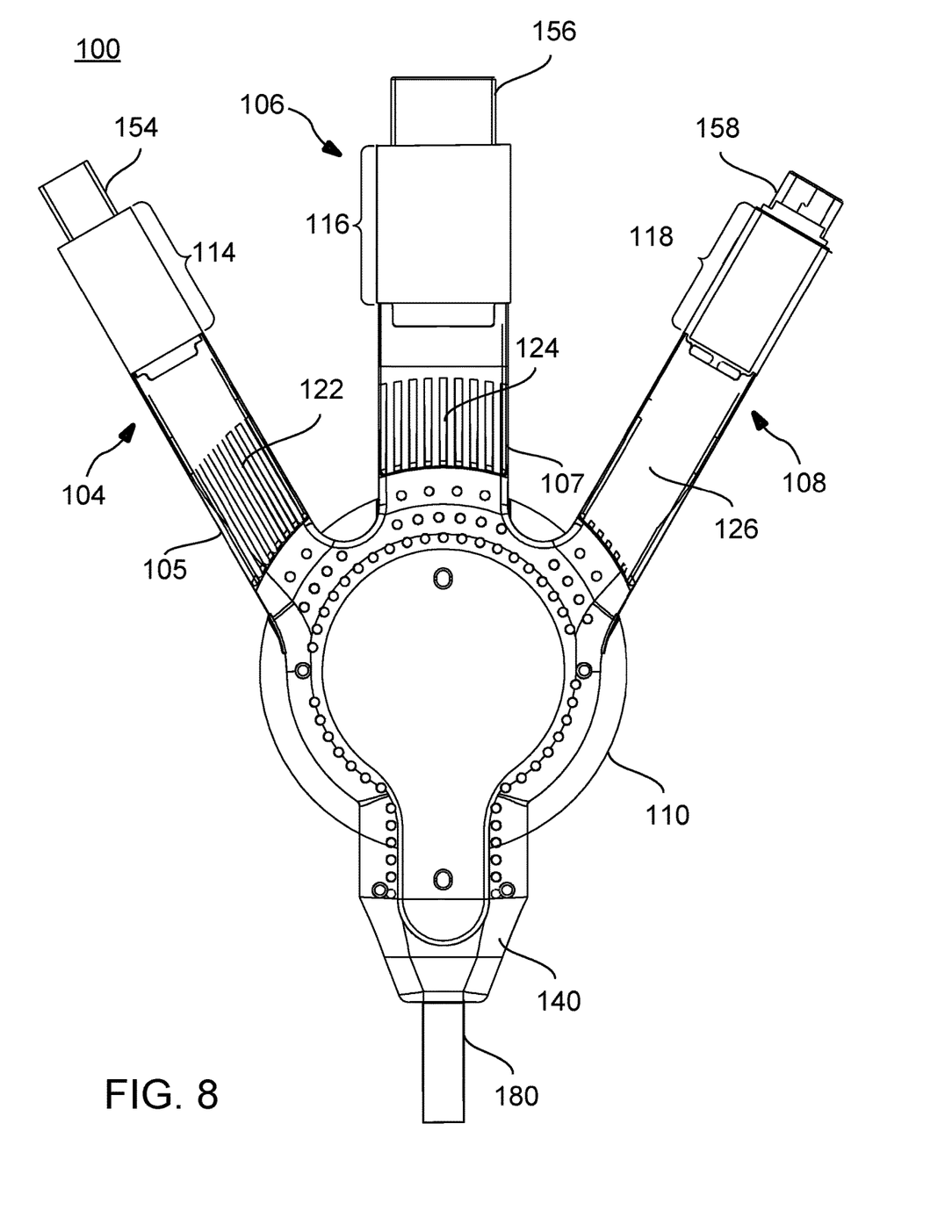
FIG. 8 shows a top view of the assembled multi-head cable connector shown in FIG. 1.

FIG. 8 shows the multi-head cable connector 100 when the elements shown in FIG. 1 are assembled according to an embodiment. That is, FIG. 8 shows the first finger or branch 104 with the front flexible element 122 and the back flexible element 132 mounted to the front flexible part 105 and held in place by the front cover plate 140 and the back cover plate 142, respectively. Further, the second finger or branch 106 is shown with the front flexible element 124 and the back flexible element 134 mounted to the front flexible part 107 and respectively held in place by the front cover plate 140 and the back cover plate 142. Moreover, the third finger or branch 108 is shown with the front flexible element 126 and the back flexible element 136 mounted to the front flexible part 109 and similarly held in place by the front cover plate 140 and the back cover plate 142. The cable 180 extends outward from an opening 146, shown in FIG. 1, that is formed between the front cover plate 140 and the back cover plate 142.

Figure 9:
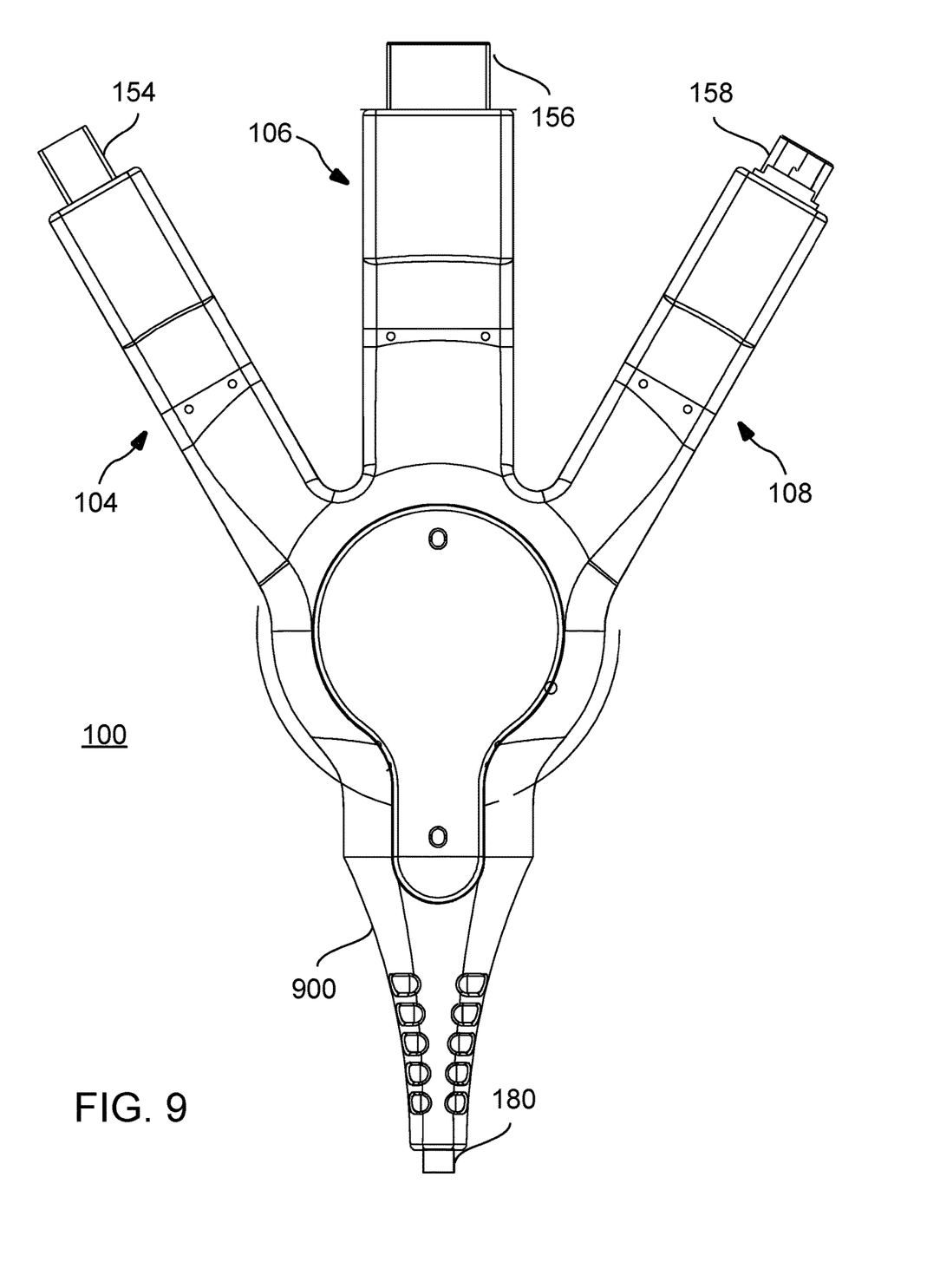
FIG. 9 shows a top view of the assembled multi-head cable connector shown in FIG. 8 covered with its external skin.

FIG. 9 shows a top view of the assembled multi-head cable connector 100 of FIG. 8 with an over-molded rubber skin 900 or the like according to an embodiment. The rubber skin 900 covers the entirety of the multi-head cable connector 100 except for the connector terminals 154, 156, and 158, which extend through respective openings in the rubber skin 900. The cable 180 also extends through another opening in the rubber skin 900.

Figure 10:
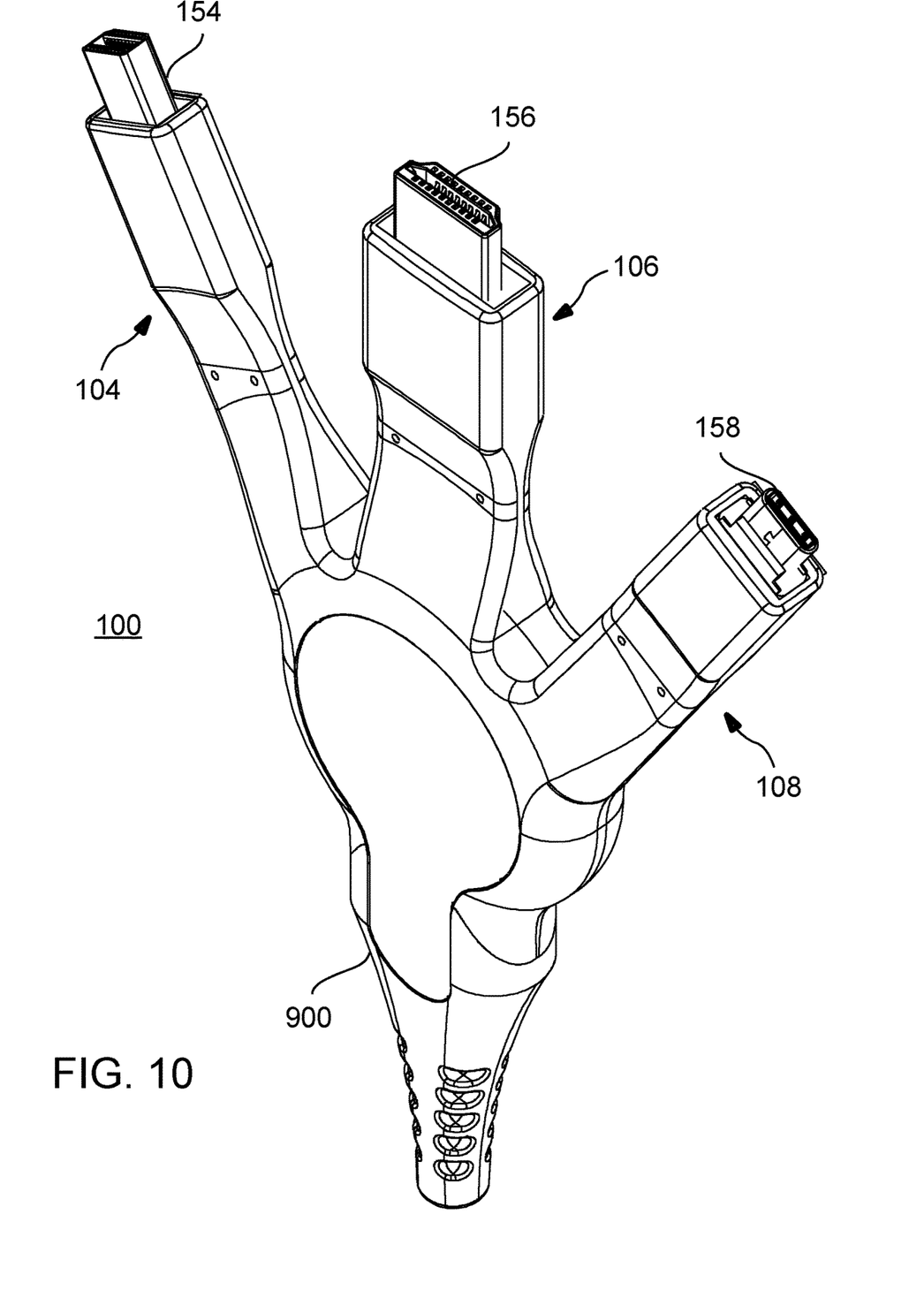
FIG. 10 shows a perspective view of the multi-head cable connector shown in FIG. 9.

FIG. 10 shows a perspective view of the multi-head cable connector 100 shown in FIG. 9.

As an example of the multi-head cable connector 100 in use, the connector terminal of the second finger or branch 106 may be inserted into a first port of an external device (not shown). In accordance with an embodiment, the first finger or branch 104 is flexible and may be bent up or down to be clear of any adjacent ports to allow another cable connector to be inserted into the adjacent ports. Upon removal of the connector terminal of the second finger or branch 106 from the first port, the first finger or branch 104 reverts to its original shape.

Also in accordance with the embodiment, the third finger or branch 108 is flexible and may be bent up or down to be clear of any other adjacent ports to allow additional connectors to be inserted into these ports. Upon removal of the connector terminal of the second finger or branch 106 from the first port, the third finger or branch 108 reverts to its original shape.

Alternatively, the connector terminal of the first finger or branch 104 may be inserted into a port of an external device, and one or both of the flexible second and third fingers or branches 106, 108 may be bent in accordance with the embodiment to clear that finger or branch away from another port in the external device. Upon removal of the connector terminal of the first finger or branch 104 from the port, the bent finger or branch 106, 108 reverts to its original shape.

As a further alternative, the connector terminal of the third finger or branch 108 may be inserted into a port of an external device, and one or both of the flexible first and second fingers or branches 104, 106 may be bent in accordance with the embodiment to clear that finger or branch away from another port in the external device. Upon removal of the connector terminal of the third finger or branch 108 from the port, the bent finger or branch 104, 106 reverts to its original shape.

In this manner, the multi-head cable connector of the embodiment provides a cable connector having a plurality of flexible fingers, each of which is independently bendable yet sufficiently rigid so as to return to its original shape after bending.

Though the embodiment shows a multi-head cable connector having three flexible fingers or branches, other examples having fewer or more than three fingers or branches are also within the scope of the embodiments.

INDUSTRIAL APPLICABILITY

To solve the aforementioned problems, the present embodiments provide a multi-head cable connector with flexible fingers.

It should be understood that this description is not intended to limit the embodiments. On the contrary, the embodiments are intended to cover alternatives, modifications, and equivalents, which are included in the spirit and scope of the embodiments as defined by the appended claims. Further, in the detailed description of the embodiments, numerous specific details are set forth to provide a comprehensive understanding of the claimed embodiments. However, one skilled in the art would understand that various embodiments may be practiced without such specific details.

Although the features and elements of aspects of the embodiments are described as being in particular combinations, each feature or element may be used alone, without the other features and elements of the embodiments, or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

The above-described embodiments are intended to be illustrative in all respects, rather than restrictive, of the embodiments. Thus, the embodiments are capable of many variations in detailed implementation that may be derived from the description contained herein by a person skilled in the art. No element, act, or instruction used in the description of the present application should be construed as critical or essential to the embodiments unless explicitly described as such. Also, as used herein, the article "a" is intended to include one or more items.

In addition, the above disclosed methods are not meant to limit the aspects of the embodiments, or to suggest that the aspects of the embodiments should be implemented following the aforementioned methods. The purpose of the aforementioned methods is to facilitate the understanding of one or more aspects of the embodiments and to provide the reader with one or many possible implementations of the processed discussed herein. It should be understood by one of ordinary skill in the art that the steps of the aforementioned methods may be performed in a different order and that some steps may be eliminated or substituted.

All United States patents and applications, foreign patents, and publications discussed above are hereby incorporated herein by reference in their entireties.

ALTERNATE EMBODIMENTS

Alternate embodiments may be devised without departing from the spirit or the scope of the embodiments.

What is claimed is:

1. An electronic connector, comprising:
   (a) an electrical board, including:
      (1) a rigid central region, and
      (2) at least one branch that extends away from the central region, and including
         (A) a flexible part disposed at one end of the at least one branch and adjacent to the rigid central region,
         (B) a conductor terminal located at an opposing end of the at least one branch,
         (C) a rigid part disposed between the flexible part and the conductor terminal, and
         (D) at least one flexible element disposed adjacent to one surface of the flexible part,
      (3) wherein
         (A) the flexible part of the at least one branch and the at least one flexible element combine to permit the at least one branch to be both (i) sufficiently flexible to permit the at least one branch to be bent, and (ii) sufficiently rigid to permit the at least one branch to subsequently return to its original shape, and
         (B) the at least one flexible element
            (i) is thinnest in a bendable region located part way between opposing ends of the at least one flexible element, and
            (ii) increases in thickness and rigidity with increasing proximity to each of the opposing ends.

2. An electronic connector, comprising:
   (a) an electrical board, including:
      (1) a rigid central region, and
      (2) at least one branch that extends away from the central region, and including
         (A) a flexible part disposed at one end of the at least one branch and adjacent to the rigid central region,
         (B) a conductor terminal located at an opposing end of the at least one branch,
         (C) a rigid part disposed between the flexible part and the conductor terminal, and
         (D) at least one flexible element disposed adjacent to one surface of the flexible part,
      (3) wherein the flexible part of the at least one branch and the at least one flexible element combine to permit the at least one branch to be both (i) sufficiently flexible to permit the at least one branch to be bent, and (ii) sufficiently rigid to permit the at least one branch to subsequently return to its original shape, and
      (4) further comprising
         (A) a further flexible element associated with the least one branch and disposed adjacent to another surface of the flexible part;
         (B) wherein the flexible part of the at least one branch, the at least one flexible element, and the further flexible element combine to permit the at least one branch to be both (i) sufficiently flexible to permit the branch to be bent, and (ii) sufficiently rigid to permit the at least one branch to subsequently return to its original shape.

3. The electronic connector of claim 2, wherein
   (a) the further flexible element
      (1) is thinnest in a bendable region located part way between opposing ends of the further flexible element, and
      (2) increases in thickness and rigidity with increasing proximity to each of the opposing ends.

4. The electronic connector of claim 2, wherein
   (a) the flexible part of the at least one branch is comprised of aluminum, and
   (b) the at least one flexible element and the further flexible element are each comprised of a plastic material.

5. An electronic connector, comprising:
   (a) an electrical board, including:
      (1) a rigid central region, and
      (2) at least one branch that extends away from the central region, and including
         (A) a flexible part disposed at one end of the at least one branch and adjacent to the rigid central region,
         (B) a conductor terminal located at an opposing end of the at least one branch,
         (C) a rigid part disposed between the flexible part and the conductor terminal, and
         (D) at least one flexible element disposed adjacent to one surface of the flexible part,
      (3) wherein
         (A) the flexible part of the at least one branch and the at least one flexible element combine to permit the at least one branch to be both (i) sufficiently flexible to permit the at least one branch to be bent, and (ii) sufficiently rigid to permit the at least one branch to subsequently return to its original shape, and
         (B) the rigid central region further comprises
            (i) at least one stub portion extending from and unitary with the rigid central region, the at least one stub portion being disposed between the rigid central region and the flexible part of the at least one branch.

6. An electronic connector, comprising:
   (a) an electrical board, including:
      (1) a rigid central region, and
      (2) at least one branch that extends away from the central region, and including
         (A) a flexible part disposed at one end of the at least one branch and adjacent to the rigid central region,
         (B) a conductor terminal located at an opposing end of the at least one branch,
         (C) a rigid part disposed between the flexible part and the conductor terminal, and
         (D) at least one flexible element disposed adjacent to one surface of the flexible part,
      (3) wherein
         (A) the flexible part of the at least one branch and the at least one flexible element combine to permit the at least one branch to be both (i) sufficiently flexible to permit the at least one branch to be bent, and (ii) sufficiently rigid to permit the at least one branch to subsequently return to its original shape,
         (B) the electrical board further comprises
            (i) at least another branch that extends away from the central region, and including
               (I) another flexible part disposed at one end of the at least another branch and adjacent to the rigid central region,
               (II) another conductor terminal located at an opposing end of the least another branch,
               (III) another rigid part disposed between the another flexible part and the another conductor terminal, and
               (IV) at least another flexible element disposed adjacent to one surface of the flexible part, (ii) wherein the another flexible part of the at least another branch and the at least another flexible element combine to permit the at least another branch to be both (i) sufficiently flexible to permit the at least another branch to be bent, and (ii) sufficiently rigid to permit the at least another branch to subsequently return to its original shape, and
(4) further comprising
  (A) another further flexible element associated with the least another branch and disposed adjacent to another surface of the another flexible part,
  (B) wherein the another flexible part of the at least another branch, the at least another flexible element of the least another branch, and the further another flexible element of the least another branch element combine to permit the at least another branch to be both (i) sufficiently flexible to permit the branch to be bent, and (ii) sufficiently rigid to permit the at least another branch to subsequently return to its original shape,
(5) wherein
  (A) the another further flexible element
    (i) is thinnest in a bendable region located part way between opposing ends of the another further flexible element, and
    (ii) increases in thickness and rigidity with increasing proximity to each of the opposing ends.

7. An electronic connector, comprising:
(a) an electrical board, including:
  (1) a rigid central region, and
  (2) at least one branch that extends away from the central region, and including
    (A) a flexible part disposed at one end of the at least one branch and adjacent to the rigid central region,
    (B) a conductor terminal located at an opposing end of the at least one branch,
    (C) a rigid part disposed between the flexible part and the conductor terminal, and
    (D) at least one flexible element disposed adjacent to one surface of the flexible part,
  (3) wherein
    (A) the flexible part of the at least one branch and the at least one flexible element combine to permit the at least one branch to be both (i) sufficiently flexible to permit the at least one branch to be bent, and (ii) sufficiently rigid to permit the at least one branch to subsequently return to its original shape,
    (B) the electrical board further comprises
      (i) at least another branch that extends away from the central region, and including
        (I) another flexible part disposed at one end of the at least another branch and adjacent to the rigid central region,
        (II) another conductor terminal located at an opposing end of the least another branch,
        (III) another rigid part disposed between the another flexible part and the another conductor terminal, and
        (IV) at least another flexible element disposed adjacent to one surface of the flexible part,
      (ii) wherein the another flexible part of the at least another branch and the at least another flexible element combine to permit the at least another branch to be both (i) sufficiently flexible to permit the at least another branch to be bent, and (ii) sufficiently rigid to permit the at least another branch to subsequently return to its original shape, and
(4) further comprising
  (A) another further flexible element associated with the least another branch and disposed adjacent to another surface of the another flexible part,
  (B) wherein the another flexible part of the at least another branch, the at least another flexible element of the least another branch, and the further another flexible element of the least another branch element combine to permit the at least another branch to be both (i) sufficiently flexible to permit the branch to be bent, and (ii) sufficiently rigid to permit the at least another branch to subsequently return to its original shape,
(5) wherein
  (A) the flexible part of the at least another branch is comprised of aluminum, and
  (B) the at least another flexible element and the another further flexible element are each comprised of a plastic material.

8. An electronic connector, comprising:
(a) an electrical board, including:
  (1) a rigid central region, and
  (2) at least one branch that extends away from the central region, and including
    (A) a flexible part disposed at one end of the at least one branch and adjacent to the rigid central region,
    (B) a conductor terminal located at an opposing end of the at least one branch,
    (C) a rigid part disposed between the flexible part and the conductor terminal, and
    (D) at least one flexible element disposed adjacent to one surface of the flexible part,
  (3) wherein
    (A) the flexible part of the at least one branch and the at least one flexible element combine to permit the at least one branch to be both (i) sufficiently flexible to permit the at least one branch to be bent, and (ii) sufficiently rigid to permit the at least one branch to subsequently return to its original shape,
    (B) the electrical board further comprises
      (i) at least another branch that extends away from the central region, and including
        (I) another flexible part disposed at one end of the at least another branch and adjacent to the rigid central region,
        (II) another conductor terminal located at an opposing end of the least another branch,
        (III) another rigid part disposed between the another flexible part and the another conductor terminal, and
        (IV) at least another flexible element disposed adjacent to one surface of the flexible part,
      (ii) wherein the another flexible part of the at least another branch and the at least another flexible element combine to permit the at least another branch to be both (i) sufficiently flexible to permit the at least another branch to be bent, and (ii) sufficiently rigid to permit the at least another branch to subsequently return to its original shape, and (4) wherein
  (A) the rigid central region further comprises
    (i) at least another stub portion extending from and unitary with the rigid central region, the at least another stub portion being disposed between the rigid central region and the flexible part of the at least another branch.

9. N electronic connector, comprising:
(a) an electrical board including:
  (1) a rigid central region, and
  (2) a plurality of branches that each extend away from the central region, each including
    (A) a flexible part disposed at one end of that branch and adjacent to the rigid central region,
    (B) a conductor terminal located at an opposing end of that branch,
    (C) a rigid part disposed between the flexible part and the conductor terminal,
    (D) a first flexible element disposed adjacent to a first surface of the flexible part, and
    (E) a second flexible element disposed adjacent to a second surface of the flexible part,
    (F) wherein the first and second flexible elements are each
      (i) thinnest in a bendable region part way between opposing ends of that flexible element, and
      (ii) increase in thickness and rigidity with increasing proximity to each of its opposing ends;
  (3) wherein
    (A) for each one of the plurality of branches, the flexible part and the first and second flexible elements combine to permit that branch to be both (i) sufficiently flexible to permit that branch to be bent, and (ii) sufficiently rigid to permit that branch to subsequently return to its original shape,
    (B) upon a given one of the plurality of branches being inserted into a port of a device, at least another one of the plurality of branches is bendable to clear an adjacent port of that device, and
    (C) upon the given one of the plurality of branches being removed from the port of the device, the another one of the plurality of branches returns to its original shape.

10. N electronic connector, comprising:
(a) an electrical board including:
  (1) a rigid central region, including
    (A) first, second and third stub portions each extending from and unitary with the rigid central region
  (2) first, second and third branches each extending away from the central region, each including
    (A) a flexible part at one end of that branch and extending from a respective one of the first, second and third stub portions, the flexible part being comprised of aluminum,
    (B) a conductor terminal located at an opposing end of that branch,
    (C) a rigid part disposed between the flexible part and the conductor terminal,
    (D) a first flexible element disposed adjacent to a first surface of the flexible part, and
    (E) a second flexible element disposed adjacent to a second surface of the flexible part,
    (F) wherein the first and second flexible elements are each
      (i) comprised of a plastic material,
      (ii) thinnest in a bendable region part way between opposing ends of that flexible element, and
      (iii) increase in thickness and rigidity with increasing proximity to each of its opposing ends;
  (3) wherein
    (A) for each one of the first, second and third branches, the flexible part and the first and second flexible elements of that branch combine to permit that branch to be both (i) sufficiently flexible to permit that branch to be bent, and (ii) sufficiently rigid to permit that branch to subsequently return to its original shape,
    (B) upon a given one of the first, second and third branches being inserted into a port of a device, another one of the first, second and third branches is bendable to clear an adjacent port of that device, and
    (C) upon the given one of the first, second and third branches being removed from the port of the device, the another one of the first, second and third branches returns to its original shape;
(b) electronic circuitry disposed on
  (1) the rigid central region of the electrical board and electrically connected to a cable extending from the rigid central region, or
  (2) the rigid part of at least one of the first, second and third branch and electrically connected to the conductor terminal of that branch;
(c) a pair of cover plates disposed atop opposing sides of the rigid central region of the electrical board; and
(d) an external skin covering pair of cover plates and the electrical board, wherein
  (1) the conductor terminal of each of the first, second and third branched extends through an associated opening in the external skin, and
  (2) the external skin is comprised of a rubber material.

* * * * *